(12) United States Patent
Chen

(10) Patent No.: US 7,816,957 B2
(45) Date of Patent: Oct. 19, 2010

(54) POWER ON RESET GENERATING CIRCUIT AND METHOD THEREOF

(75) Inventor: Yu-Ren Chen, Hsinchu (TW)

(73) Assignee: Holtek Semiconductor Inc., Hsinchu (TW)

( * ) Notice: Subject to any disclaimer, the term of this patent is extended or adjusted under 35 U.S.C. 154(b) by 128 days.

(21) Appl. No.: 12/250,640

(22) Filed: Oct. 14, 2008

(65) Prior Publication Data

US 2010/0060330 A1    Mar. 11, 2010

(30) Foreign Application Priority Data

Sep. 9, 2008    (TW) .............................. 97134577 A

(51) Int. Cl.
*H03L 7/00*    (2006.01)

(52) U.S. Cl. .................. 327/143; 327/142; 327/198

(58) Field of Classification Search ................. 327/142, 327/143, 198
See application file for complete search history.

(56) References Cited

U.S. PATENT DOCUMENTS

2004/0056694 A1*  3/2004  Tsai et al. .................... 327/142
2007/0080725 A1*  4/2007  Byeon et al. ................. 327/143

* cited by examiner

*Primary Examiner*—Lincoln Donovan
*Assistant Examiner*—John W Poos
(74) *Attorney, Agent, or Firm*—WPAT, PC; Justin King

(57) ABSTRACT

The invention mainly relates to a power on reset signal generating circuit and method thereof wherein said reset signal remains as a constant being independent of rising or descending power or repeated switching. The power on reset signal circuit can be implemented by a conventional RC power on reset circuit together with a coupled N-type transistor switch to charge or discharge the capacitor inside the conventional RC power on reset circuit.

18 Claims, 8 Drawing Sheets

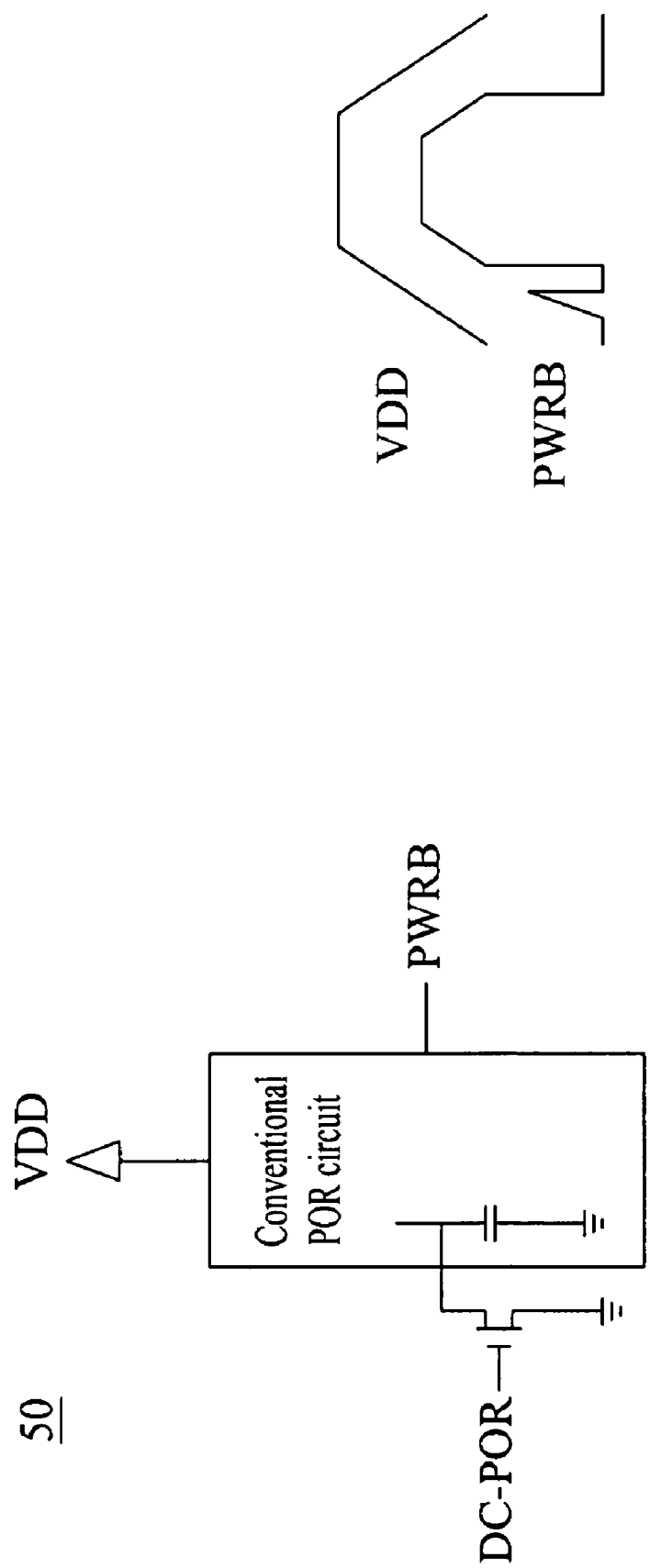

POWER ON RESET GENERATING CIRCUIT AND METHOD THEREOF

BACKGROUND OF THE INVENTION

1. Field of the invention

The present invention relates to a power on reset generating circuit and method thereof, more particularly to, a power on reset generating circuit and method thereof wherein said reset signal remains as a constant which is independent of power ascending or descending or repeated switching.

2. Description of the Prior Arts

The function of power on reset circuits is to provide a reset signal for each of individual ICs in the main circuit so as to ensure the IC to start functioning synchronously.

Refer to FIG. 1, a conventional reset signal generating circuit comprises a resistor 101, a capacitor 102, as well as a buffer 105. The buffer 105 comprises a Schmitt trigger 103 and an inverter 104. While the power is ascending, the power is charging said capacitor 102 via said resistor 101. At the time of voltage charging for the capacitor 102 to exceed the transient state point of Schmitt trigger 103 at the next stage, the circuit generates a reset signal. The reset voltage is usually relevant to the speed of power ascending. The faster the voltage of the power ascends, the higher the reset voltage is. The slower the voltage of the power ascends, the lower the reset voltage is or sometime there is no reset signal generated. During the process of voltage descending, due to the passive discharging mechanism as suggested by the conventional RC structure, the capacitor 102 in the circuit is discharging the power. As a result, during the power descending procedure, the voltage at the capacitor is higher than the power all the time, and no reset signal is generated accordingly. Another issue to be addressed is, after a plurality of reset signals being generated, the capacitor 102 cannot be fully discharged to ground, as depicted in FIG. 2. When the process of transient discharging followed consecutively by a power ascending, a higher power on reset voltage or a system failure to generate a reset signal may occur such that the system functions improperly.

Accordingly, in view of the above drawbacks, it is an imperative that an improved power on reset generating circuit is designed so as to solve the drawbacks as the foregoing.

SUMMARY OF THE INVENTION

In view of the disadvantages of prior art, the primary object of the present invention relates to a constant power on reset signal generating circuit and method thereof, which takes advantage of a power detection circuit to control the discharging of the capacitor inside the conventional power on reset generating circuit so as to achieve the goal of remaining the reset signal as a constant.

According to one aspect of the present invention, one skilled in the art can address the sensitivity issue of the power ascending speed for the power on reset generating circuit via the disclosure of the present invention.

According to another aspect of the present invention, one skilled in the art can also address the issue such that the voltage of the capacitor inside the conventional power on reset generating circuit is higher than that of the power supply and cannot discharge due to a plurality of power risings for the power on reset generating circuit.

Preferably, said method comprises the steps of:
(a) arising the power supply;
(b) establishing a reference voltage according to said arising power supply;
(c) judging whether said reference voltage is lower than a transient point of an inverter, if no, goes to step (b), if yes, goes to step (d);
(d) charging a capacitor inside a conventional RC power on reset generating circuit; and
(e) generating a reset signal to a system during the capacitor charging process.

The present invention further relates to a circuit controlling the discharging of a capacitor inside a conventional RC power on reset generating circuit, comprises:
a voltage generator;
a first inverter, coupled to said generator's output;
a second inverter, coupled to said first inverter's output; and
a N-typed transistor switch, wherein its gate is coupled to said second inverter's output.

A power on reset generating circuit, comprises:
a capacitor, wherein one side of said capacitor is coupled to ground,
a resistor, wherein one side of said resistor is coupled to a power supply, and another side of said resistor is coupled to another side of said capacitor;
a buffer, wherein its output is coupled to another side of said capacitor;
a voltage detecting circuit, said detecting circuit outputs a signal for charging and discharging; and
a N-typed transistor switch, wherein a drain of said switch is coupled to another side of said capacitor and a gate of said switch is coupled to said signal for charging and discharging.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become readily understood from the detailed description given herein below and the accompanying drawings which are given by way of illustration only, and thus are not limitative of the present invention and wherein:

FIG. 5A is a schematic view of the reset signal disclosed in the present invention;

FIG. 5B is a reset signal for the present invention and its waveform diagram;

DESCRIPTION OF THE EXEMPLARY EMBODIMENTS

The following descriptions are of exemplary embodiments only, and are not intended to limit the scope, applicability, or configuration of the invention in any way. Rather, the following description provides a convenient illustration for implementing exemplary embodiments of the invention. Various changes to the described embodiments may be made in the function and arrangement of the elements described. For your esteemed members of reviewing committee to further understand and recognize the fulfilled functions and structural characteristics of the invention, several exemplary embodiments cooperating with detailed description are presented as the follows.

Figure 1:
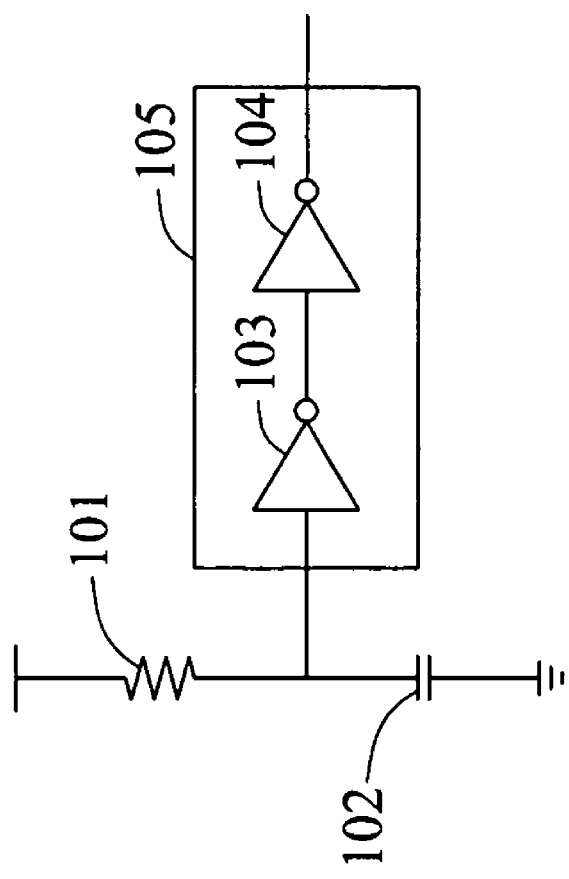
FIG. 1 is a schematic view of the prior art embodiment.
Figure 2:
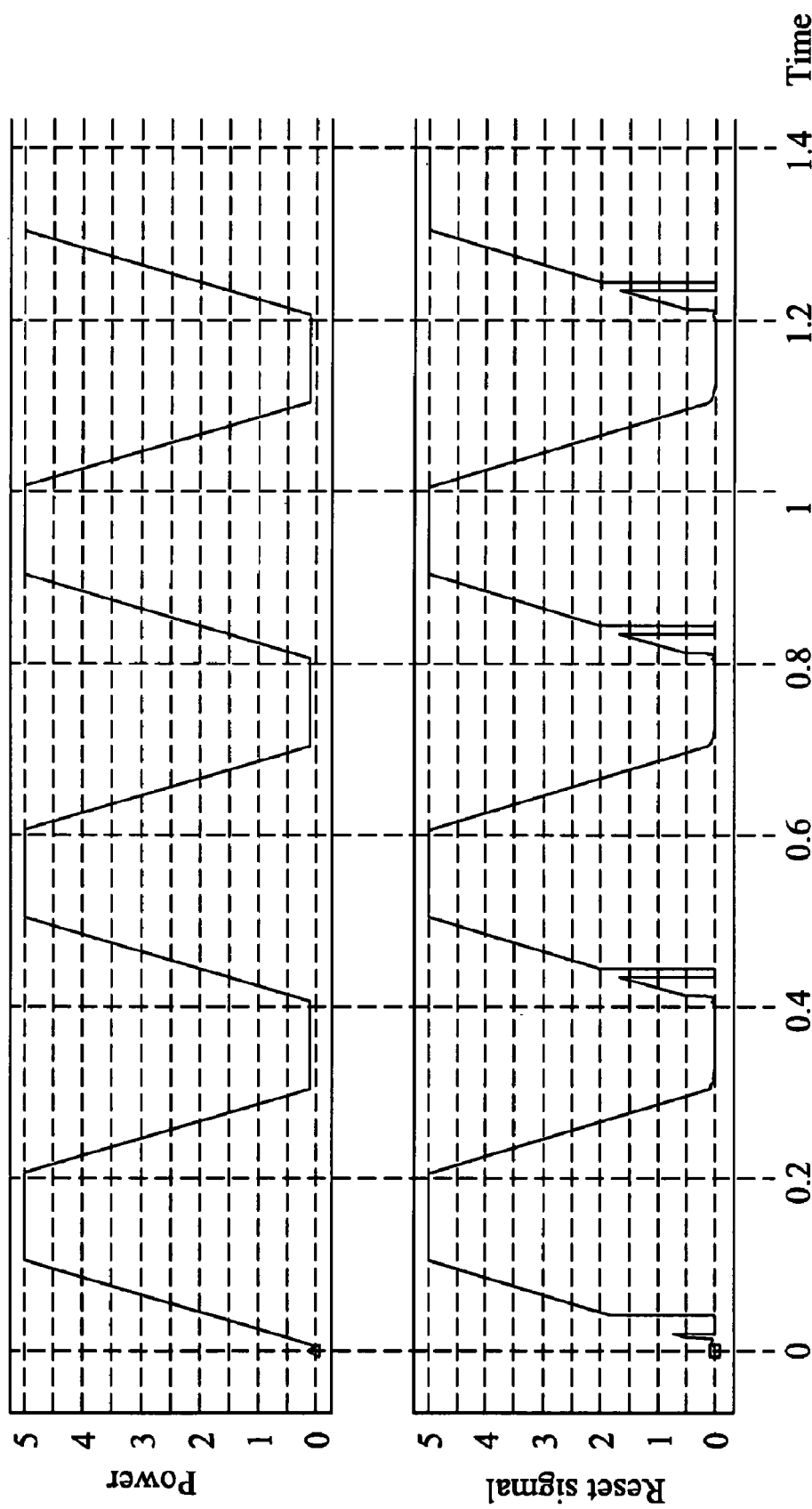
FIG. 2 is a waveform plot of the reset signal of the prior art.
Figure 3:
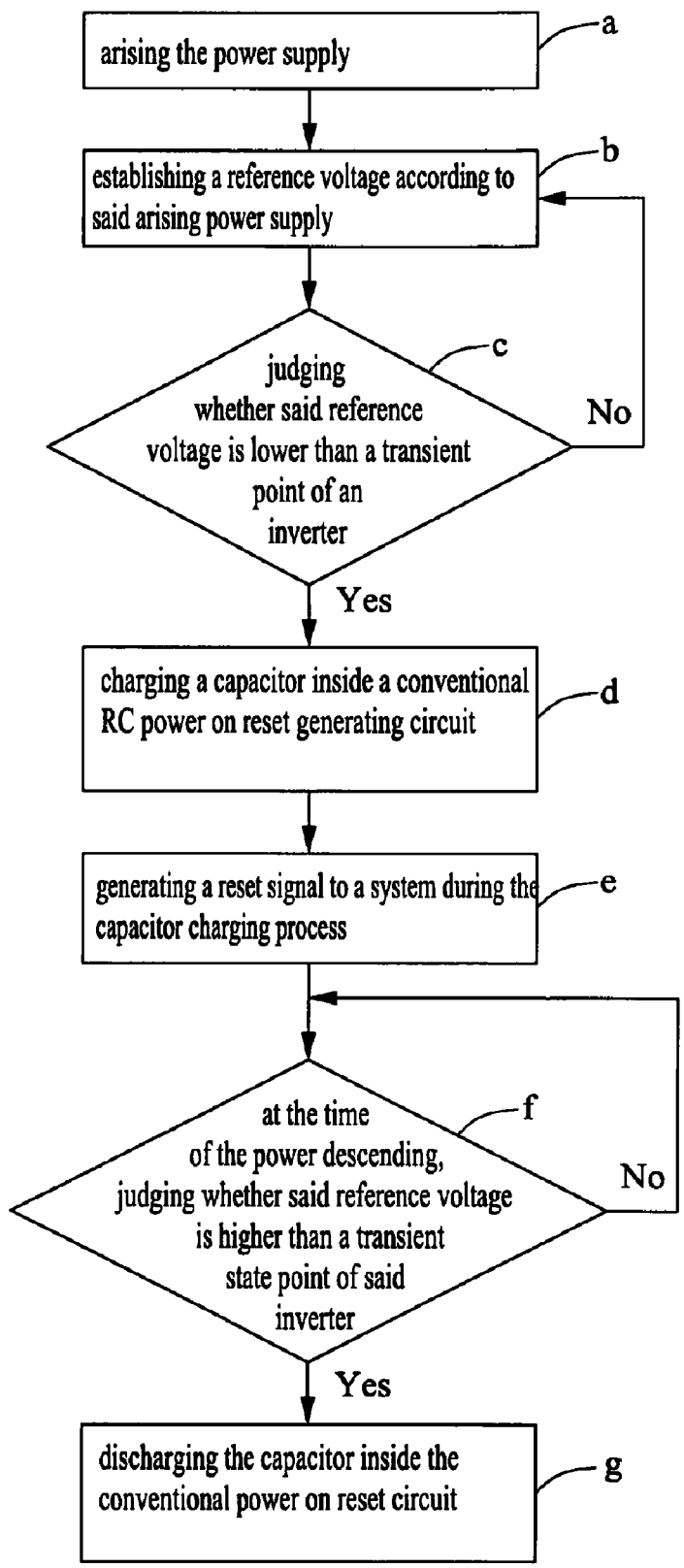
FIG. 3 is a flow chart of the method disclosed in the present invention.

Referring to FIG. 3 now, FIG. 3 relates to a constant power on reset signal generating method. Said method comprises the steps of:
(a) arising the power supply;
(b) establishing a reference voltage according to said arising power supply;
(c) judging whether said reference voltage is lower than a transient point of an inverter, if no, goes to step (b), if yes, goes to step (d);
(d) charging a capacitor inside a conventional RC power on reset generating circuit;
(e) generating a reset signal to a system during the capacitor charging process.
(f) at the time of the power descending, judging whether said reference voltage is higher than a transient state point of said inverter, if yes, goes to step (g); and
(g) discharging the capacitor inside the conventional power on reset circuit.

Preferably, said reference voltage can be a voltage which is a little higher than a threshold voltage of a N-typed transistor. Said reference voltage can be also established by a conventional band gap reference.

Preferably, the voltage rising or falling speed is within the range of 0.5V/ms and 0.5V/s.

Preferably, the power on reset signal generated by said method is independent of power rising speed or repeated switching of the power.

Said method is aided to judge whether the power supply is higher than the reset voltage than the system specified so as to control the charging procedure of the conventional power on reset circuit and a reset signal can be further established. Also, during the process of power descending, said method can judge if the power is too low to generate a signal and be applied to control the capacitor discharging action of said conventional power on reset circuit so as to enact the power on reset circuit to generate a reset signal, therefore, the charge on the capacitor can be effectively discharged to ensure the status of internal capacitor to be identical to the one at the previous time such that at the next time the power is turning on, the generated reset voltage will not be enhanced higher due to incomplete discharging at the previous stage.

Figures 4A, 4B:
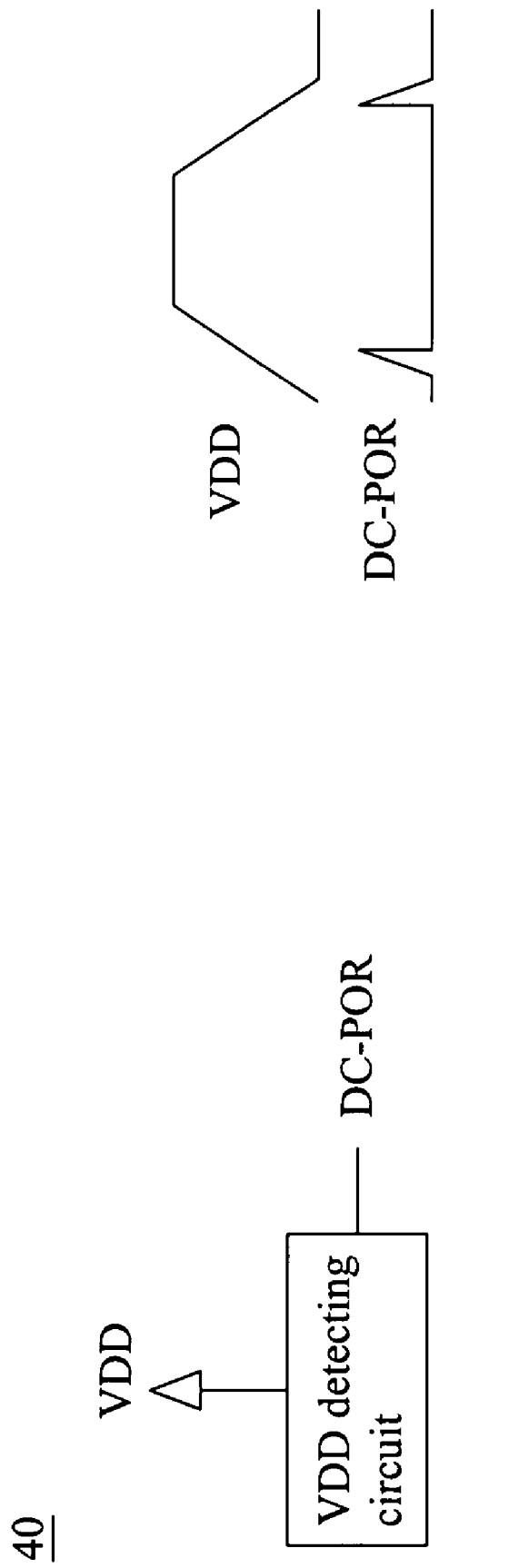
FIG. 4A is a schematic view of the voltage detecting circuit disclosed in the present invention.
FIG. 4B is an output waveform plot of the voltage detecting circuit disclosed in the present invention.
Figure 4C:
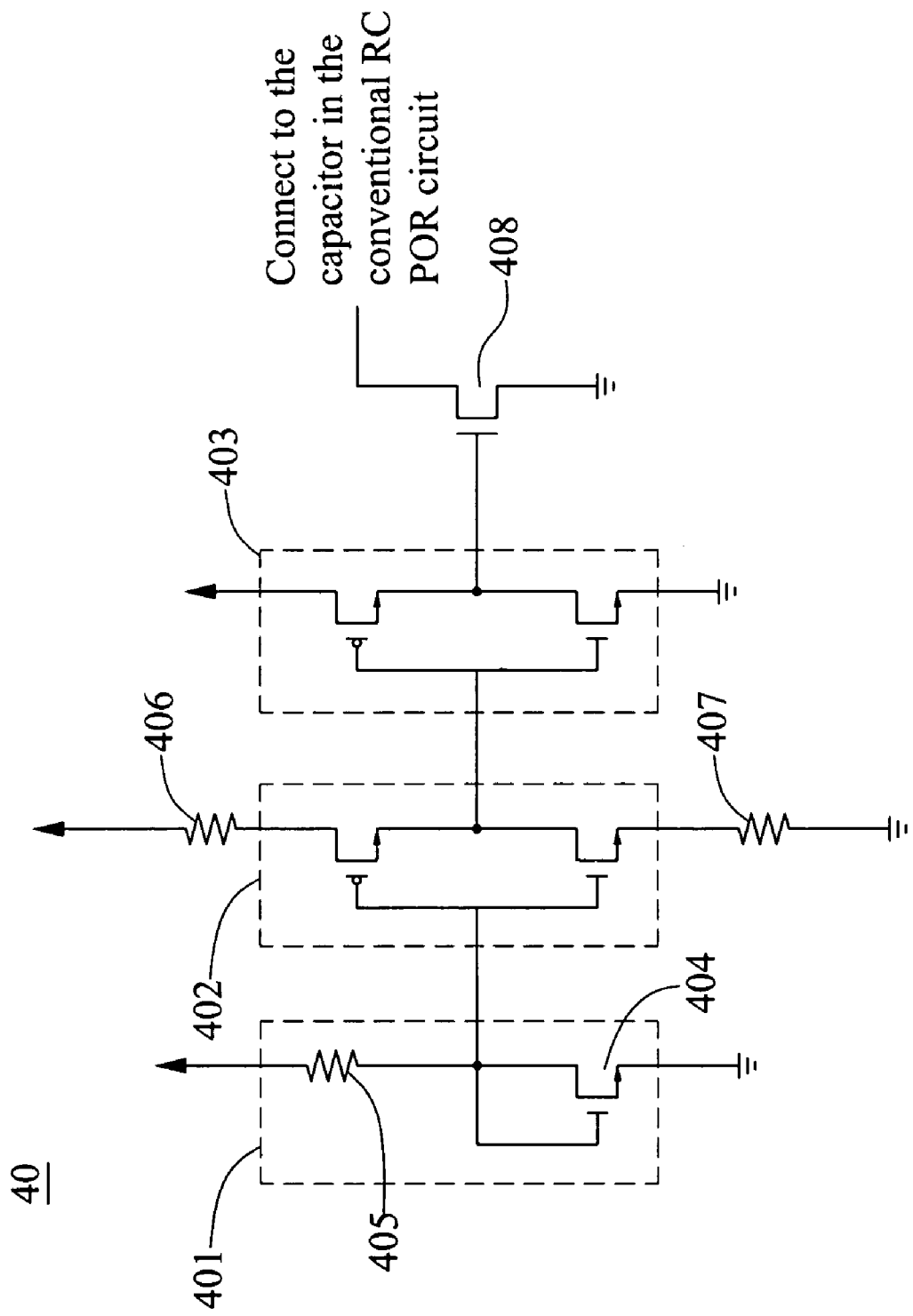
FIG. 4C is a circuit for the voltage detecting circuit disclosed in the present invention.

FIG. 4A relates to a voltage detecting circuit 40 in the present invention, and its output waveform is depicted in FIG. 4B and its detailed circuit is depicted in FIG. 4C. Said voltage detecting circuit 40 comprises: a voltage generator 401; said generator 401 can be implemented by a N-typed transistor 404, for which the gate and drain of 404 are interconnected with one side of a resistor 405, and then the source of 404 is connected to ground and another side of said resistor 405 is connected to the power supply; and said 401 can also be a band-gap reference circuit; a first inverter 402, said 402 is coupled to said 402's output; preferably, two sides of said inverter 402 can be interconnected with a resistor 406 and a resistor 407 respectively; a second inverter 403, said 403 is coupled to the 402's output, and a N-typed transistor switch 408, said 408's gate is coupled to said 403's output.

Preferably, said resistor 405, said resistor 406, and said resistor 407 are long channeled transistors.

Figure 5C:
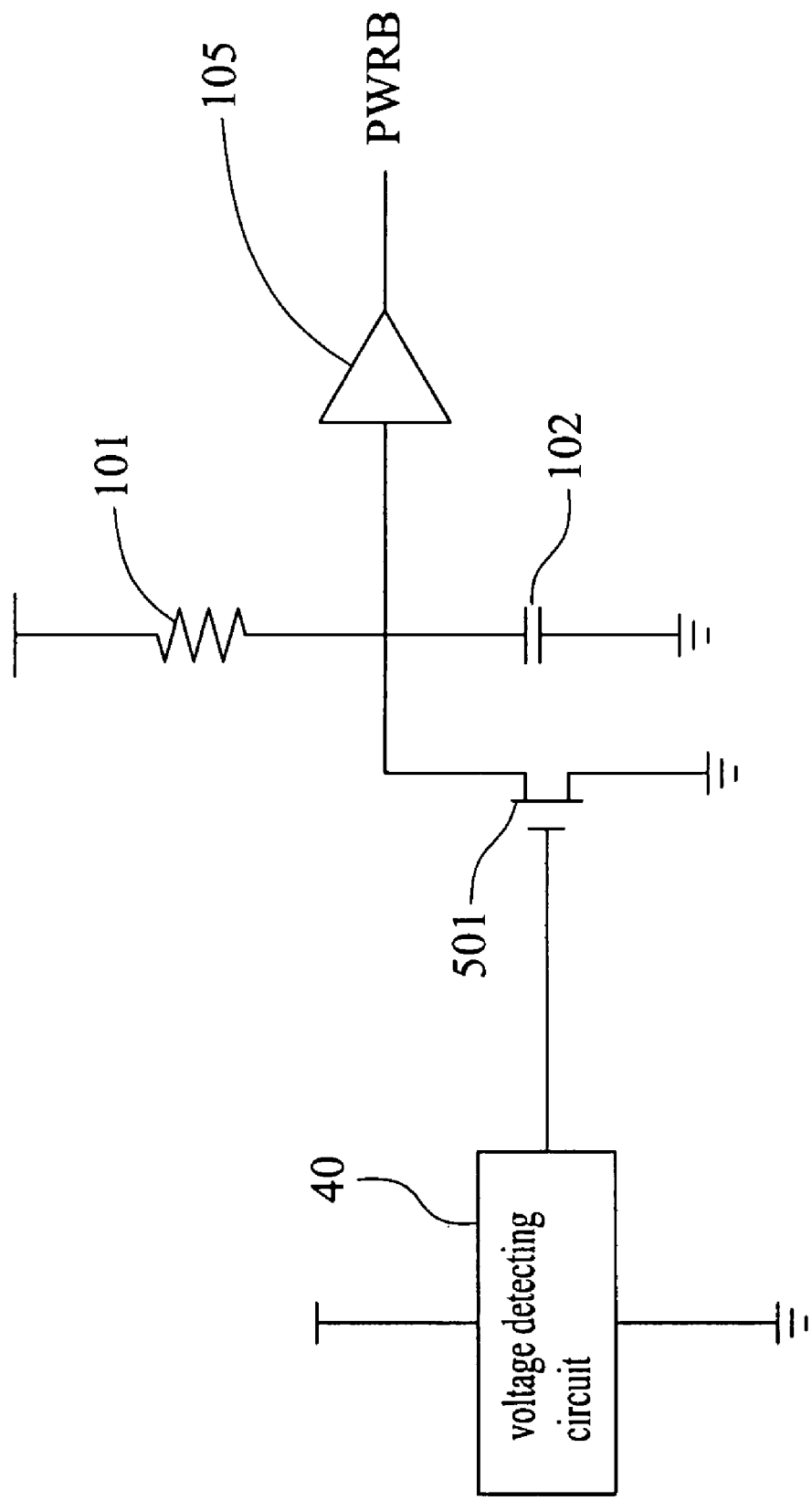
FIG. 5C is a schematic view of the reset signal circuit disclosed in the present invention.
Figure 6:
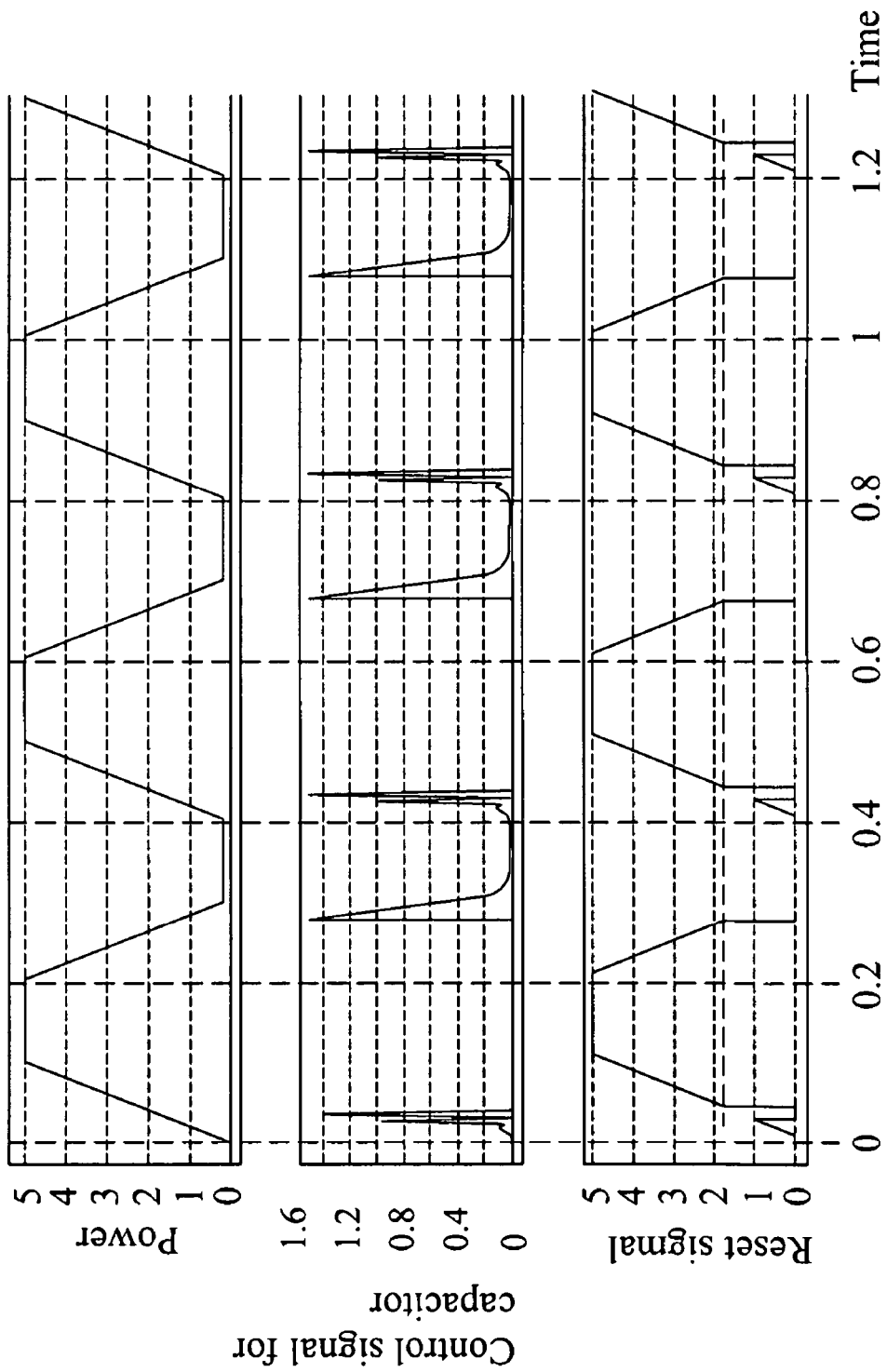
FIG. 6 is a waveform plot of the reset signal disclosed in the present invention.

Referring to FIG. 5A, a control switch 501 is added for the capacitor 102 at a conventional power on reset structure 10, and its output waveform is suggested in FIG. 5B, said structure 10 uses the detecting structure suggested in FIG. 4C to control the switch 501 in FIG. 5C and determine said capacitor 102 to charge or discharge. During the process of power ascending, said detecting circuit 40 firstly provides a control signal to discharge the capacitor 102 in said structure 10 and until the reference voltage provided by the power supply is lower than transient state point of next-stage inverter 103, then the control signal is turned off so as to charge said capacitor 102, as depicted in FIG. 6. During the process of power descending, if the reference voltage of said power supply is higher than the transient point of next stage inverter 103, the control signal is turned on to discharge said capacitor 102 and a reset signal is generated so as to ensure the system to enter the reset status. In another aspect, the capacitor 102 is fully discharged to ground to ensure at each of the power ascending process, the status of said capacitor 102 remains the same, therefore, there will not exist a phenomenon for the reset voltage to be enhanced higher than it was at the prior stage.

The invention being thus aforesaid, it will be obvious that the same may be varied in many ways. Such variations are not to be regarded as a departure from the spirit and scope of the invention, and all such modifications as would be obvious to one skilled in the art are intended to be included within the scope of the following claims.

I claim:

1. A power on reset generating method, comprising:
(a) arising the power supply;
(b) establishing a reference voltage according to said arising power supply, wherein said reference voltage is generated by a conventional band-gap reference;
(c) judging whether said reference voltage is lower than a transient point of an inverter, if no, goes to step (b), if yes, goes to step (d);
(d) charging a capacitor inside a conventional RC power on reset generating circuit; and
(e) generating a reset signal to a system during the capacitor charging process.

2. The method as set forth in claim 1, further comprising:
(f) at the time of the power descending, judging whether said reference voltage is higher than a transient state point of said inverter, if yes, goes to step (g); and
(g) discharging the capacitor inside the conventional power on reset circuit.

3. The method as set forth in claim 1, wherein said reference voltage is generated by a N-typed transistor, for which the gate and drain said N-Typed transistor are interconnected with one side of a resistor, and then the source of said N-typed transistor is connected to ground and another side of said resistor is connected to the power supply.

4. The method as set forth in claim 1, wherein the power on reset voltage is independent of power ascending speed.

5. The method as set forth in claim 1, wherein the power on reset voltage is independent of repeated switching of the power.

6. The method as set forth in claim 1, wherein the voltage rising or falling speed is within the range of 0.5V/ms and 0.5V/s.

7. A circuit controlling the discharging of a capacitor inside a conventional RC power on reset generating circuit, comprising:

a voltage generator, wherein said voltage generator is a conventional band-gap reference circuit;

a first inverter, coupled to said generator's output;

a second inverter, coupled to said first inverter's output; and a N-typed transistor switch, wherein its gate is coupled to said second inverter's output.

8. The circuit as set forth in claim 7, wherein said voltage generator is implemented by a N-typed transistor, for which the gate and drain said N-Typed transistor are interconnected with one side of a resistor, and then the source of said N-typed transistor is connected to ground and another side of said resistor is connected to the power supply.

9. The circuit as set forth in claim 7, wherein two sides of said first inverter are interconnected with a resistor respectively in serial.

10. The circuit as set forth in claim 8, wherein said resistor is a long channeled transistor.

11. The circuit as set forth in claim 9, wherein said resistor is a long channeled transistor.

12. A power on reset generating circuit, comprising:

a capacitor, wherein one side of said capacitor is coupled to ground;

a resistor, wherein one side of said resistor is coupled to a power supply, and another side of said resistor is coupled to another side of said capacitor;

a buffer, wherein its output is coupled to another side of said capacitor;

a N-typed transistor switch, wherein a drain of said switch is coupled to another side of said capacitor and a gate of said switch is coupled to said signal for charging and discharging; and a voltage detecting circuit, said detecting circuit outputs a signal charging and discharging, wherein said voltage detecting circuit comprising:

a voltage generator, wherein said voltage generator is a conventional band-gap reference circuit;

a first inverter, coupled to an output of said voltage generator; and a second inverter, coupled to an output of said first inverter; wherein an output of said second inverter and a gate of said N-typed transistor switch are interconnected.

13. The circuit as set forth in claim 12, wherein said resistor is a long channeled transistor.

14. The circuit as set forth in claim 12, wherein said buffer comprises a third inverter and a fourth inverter.

15. The circuit as set forth in claim 12, wherein said buffer comprises a third inverter and a Schmitt trigger.

16. The circuit as set forth in claim 12, wherein said voltage detecting circuit implemented by a N-typed transistor, for which the gate and drain said N-Typed transistor are interconnected with one side of a resistor, and then the source of said N-typed transistor is connected to ground and another side of said resistor is connected to the power supply.

17. The circuit as set forth in claim 12, wherein two sides of said first inverter are interconnected with a resistor respectively in serial.

18. The circuit as set forth in claim 12, wherein the generated reset voltage is independent of power ascending speed.

\* \* \* \* \*